(12) United States Patent
Tanaka et al.

(10) Patent No.: US 8,067,698 B2
(45) Date of Patent: Nov. 29, 2011

(54) WIRING SUBSTRATE FOR USE IN SEMICONDUCTOR APPARATUS, METHOD FOR FABRICATING THE SAME, AND SEMICONDUCTOR APPARATUS USING THE SAME

(75) Inventors: Hiroyuki Tanaka, Kyoto (JP); Hiroaki Suzuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 473 days.

(21) Appl. No.: 12/336,879

(22) Filed: Dec. 17, 2008

(65) Prior Publication Data

US 2009/0201657 A1 Aug. 13, 2009

(30) Foreign Application Priority Data

Feb. 13, 2008 (JP) .................................. 2008-031900

(51) Int. Cl.
*H05K 1/03* (2006.01)
*H05K 1/11* (2006.01)
*H01L 29/40* (2006.01)

(52) U.S. Cl. ........ 174/255; 174/260; 174/262; 174/263; 257/783

(58) Field of Classification Search ........................ None
See application file for complete search history.

(56) References Cited

U.S. PATENT DOCUMENTS

| 6,198,165 | B1 | 3/2001 | Yamaji et al. | |
| 6,323,438 | B1 * | 11/2001 | Ito | 174/261 |
| 6,531,766 | B1 * | 3/2003 | Taniguchi et al. | 257/678 |
| 7,298,043 | B2 * | 11/2007 | Yui | 257/713 |
| 7,397,000 | B2 * | 7/2008 | Shimoto et al. | 174/258 |
| 7,518,250 | B2 * | 4/2009 | Shimanuki | 257/784 |
| 7,786,569 | B2 * | 8/2010 | Nakagawa | 257/700 |
| 7,948,091 | B2 * | 5/2011 | Ohse et al. | 257/783 |

FOREIGN PATENT DOCUMENTS

| JP | 09-172104 | 6/1997 |
| JP | 10-294549 | 11/1998 |
| JP | 11-288954 | 10/1999 |
| JP | 2003-224230 | 8/2003 |

OTHER PUBLICATIONS

Japanese Office Action issued in Japanese Patent Application No. JP 2008-031900 dated Aug. 31, 2011.

* cited by examiner

*Primary Examiner* — Boris Chervinsky
(74) *Attorney, Agent, or Firm* — McDermott Will & Emery LLP

(57) ABSTRACT

On a printed-wiring board 1-1, a conductor layer 2 is laminated to both the top surface and the bottom surface of a substrate core 7 so as to pattern the substrate core, and a solder resist 4 is laminated to the substrate core. The solder resist 4 laminated to the top surface of the printed-wiring board 1-1 forms a raised portion 40 in a semiconductor chip mounting area such that the thickness of the raised portion is greater than the thickness of the solder resist 4 laminated to areas other than the semiconductor chip mounting area, so that the surface of the semiconductor chip mounting area is flat.

7 Claims, 15 Drawing Sheets

(a)

(b)

WIRING SUBSTRATE FOR USE IN SEMICONDUCTOR APPARATUS, METHOD FOR FABRICATING THE SAME, AND SEMICONDUCTOR APPARATUS USING THE SAME

BACKGROUND OF THE INVENTION

1. Field of the Invention

The present invention relates to a wiring substrate and a method for fabricating the wiring substrate, and more particularly to a wiring substrate for use in a semiconductor apparatus such as a BGA, and a method for fabricating the wiring substrate.

2. Description of the Background Art

In recent years, an electronic apparatus not only has its size and thickness reduced but also has its performance enhanced and its function diversified. In order to realize specifications of the electronic apparatus, a semiconductor apparatus, which is the most important component for the electronic apparatus, tends to have its size and thickness reduced, and further include the increased number of terminals. Under these situations, as a configuration of the semiconductor apparatus, a so-called BGA (Ball Grid Array) package, LGA (Land Grid Array) package, and the like are generally known. The BGA package and the LGA package include no external lead projecting from an outer circumference of a sealing resin portion although a conventional QFP (Quad Flat Package) includes the external lead. In these packages, solder balls are provided, as external electrodes for performing electrical connection, on the bottom surface of the semiconductor apparatus, so as to form a matrix.

A typical wiring substrate for use in a semiconductor apparatus will be described. FIG. 11 is a diagram illustrating a printed-wiring board 101 which is a typical wiring substrate for use in a semiconductor apparatus. FIG. 11(a) is a top view of the printed-wiring board 101. In FIG. 11(a), the printed-wiring board 101 is patterned with a conductor layer 102, and the conductor layer 102 is electrically connected through vias 103 to a conductor layer which is provided on the bottom surface of the printed-wiring board 101. On a bonding pad positioning area 105 of the printed-wiring board 101, a bonding pad 106 is provided so as to connect to the conductor layer 102, and a surface portion of each of the bonding pad 106 and the conductor layer 102 is Ni/Au-plated. A solder resist 104 is applied to portions other than the bonding pad positioning area 105 of the printed-wiring board 101.

FIG. 11(b) is a cross-sectional view of the printed-wiring board 101 shown in FIG. 11 (a) along lines A-B, and FIG. 12 is an enlarged view of a portion C shown in FIG. 11 (b). With reference to FIG. 11(b) and FIG. 12, a cross-sectional configuration of the printed-wiring board 101 will be described in detail. The conductor layer 102 with which the printed-wiring board 101 is patterned is laminated to both the top surface and the bottom surface of a substrate core 107. Further, the substrate core 107 has holes penetrating therethrough so as to form the vias 103. The surfaces of the vias 103 penetrating through the substrate core 107 are each copper-foil-plated, and therefore the conductor layers 102 provided on both the top and the bottom surfaces of the substrate core 107 are electrically connected to each other. The solder resist 104 is applied to portions other than the bonding pad positioning area 105 on the top surface of the printed-wiring board 101 and a ball positioning area 110 provided on the bottom surface of the printed-wiring board 101. The ball positioning area 110 is an area for allowing the printed-wiring board 101 to connect to an external electrode through a solder ball.

Further, the vias 103 in which the substrate core 107 has the copper-foil-plated surface are filled with the solder resist 104. On the other hand, the bonding pad 106 is positioned in the bonding pad positioning area 105 which is open, and further the surface of the bonding pad 106 is Ni (108)/Au (109)-plated. Moreover, the surface of the conductor layer 102 in the ball positioning area 110 is Ni (108)/Au (109)-plated.

Next, a method for fabricating a typical wiring substrate for use in a semiconductor apparatus will be described. FIG. 13 is a diagram illustrating a method for fabricating the printed-wiring board 101 shown in FIG. 11. FIGS. 13 (a) to 13(g) are diagrams illustrating cross sections of the printed-wiring board 101 in fabrication process steps (a) to (g), respectively.

In a process step (a), the conductor layer 102 is laminated to the entire top and bottom surfaces of the substrate core 107. In a process step (b), the substrate core 107 having both the top and the bottom surfaces to which the conductor layer 102 is laminated is penetrated at a predetermined portion (for example, six portions in FIG. 13) by means of a drill or a laser, so as to form the vias 103. In a process step (c), the surface of each of the vias 103 penetrating through the substrate core 107 is copper-foil-plated. In a process step (d), a portion of the conductor layer 102 laminated to both the top and the bottom surfaces of the substrate core 107 is etched and removed, so as to form a wiring pattern. In a process step (e), the solder resist 104 is applied to both the top and the bottom surfaces of the substrate core 107 to which the conductor layer 102 is laminated so as to pattern the substrate core 107. Further, the vias 103 in which the substrate core 107 has the copper-foil-plated surface are filled with the solder resist 104. In a process step (f), the solder resist 104 is etched and removed in the bonding pad positioning area 105 on the top surface of the printed-wiring board 101 and the ball positioning area 110 on the bottom surface of the printed-wiring board 101. In a process step (g), the bonding pad 106 is positioned on the surface of the conductor layer 102 exposed in the bonding pad positioning area 105, and the bonding pad 106 is Ni (108)/Au (109)-plated. Further, the surface of the conductor layer 102 exposed in the ball positioning area 110 is Ni (108)/Au (109)-plated.

Next, an exemplary semiconductor apparatus using the printed-wiring board 101 shown in FIG. 11 and FIG. 13 will be described. FIG. 14 is a diagram illustrating a semiconductor apparatus 200 using the printed-wiring board 101. In FIG. 14, components which are the same or correspond to those shown in FIG. 11 and FIG. 13 are denoted by the same corresponding reference numerals, respectively, and the description thereof is not given.

A semiconductor chip 113 is attached to the solder resist 104 in the center portion on the top surface of the printed-wiring board 101 by using a paste 112. An Au wire 111, which is a metal thin wire electrically connected to an electrode pad (not shown) on the semiconductor chip 113, is connected to the bonding pad 106 in the bonding pad positioning area 105. Thus, the semiconductor chip 113 is electrically connected to the bonding pad 106. Further, the semiconductor chip 113, the printed-wiring board 101, the paste 112, and the Au wire 111 are collectively sealed in a sealing resin 117.

The number of times the solder resist is applied to the surface of the wiring substrate for use in the semiconductor apparatus is one. There is a problem that, in the process of fabricating a semiconductor apparatus, a contact between the applied solder resist and a solder resist of a bonding tool (capillary) used for connection (wire bonding) of the metal thin wire causes uncleanness and/or deformation of the metal thin wire. In order to solve the problems, in general, the thickness of the solder resist to be applied to the surface of the wiring substrate for use in the semiconductor apparatus is smaller than about 30 μm. Further, as disclosed in Japanese Laid-Open Patent Publication No. 10-294549, in some configuration, the solder resist is thickly applied around the sealing resin in order to reduce a range in which the sealing resin is applied.

However, in the conventional wiring substrate for use in the semiconductor apparatus, unevenness is increased due to the vias and wirings in an area in which the semiconductor chip is mounted, and therefore bubbles (voids) are easily generated between an adhering component and the wiring substrate for use in the semiconductor apparatus, or between an adhering component and the semiconductor chip when the semiconductor chip is mounted. Therefore, in the fabrication process, in the inspection process, in practical use, and the like, when a temperature is increased, there is a problem that a separation between the semiconductor chip and the wiring substrate for use in the semiconductor apparatus may occur.

SUMMARY OF THE INVENTION

Therefore, an object of the present invention is to provide, for solving the problems described above, a wiring substrate for use in a semiconductor apparatus having such a stable quality as to suppress generation of bubbles (voids) between a semiconductor chip and the wiring substrate for use in the semiconductor apparatus, and prevent separation between the semiconductor chip and the wiring substrate for use in the semiconductor apparatus when the semiconductor chip is mounted, by reducing unevenness in an area in which the semiconductor chip is mounted to the wiring substrate for use in the semiconductor apparatus, and a method for fabricating the wiring substrate for use in the semiconductor apparatus.

In order to attain the object mentioned above, a wiring substrate for use in a semiconductor apparatus according to the present invention comprises: a conductor layer laminated to a top surface and a bottom surface of a substrate core so as to pattern the substrate core; a via penetrating through the substrate core so as to electrically connect between the top surface and the bottom surface of the substrate core to which the conductor layer is laminated; a bonding pad positioning area positioned on the conductor layer laminated to the top surface of the substrate core; and a solder resist laminated to the top surface and the bottom surface of the substrate core to which the conductor layer is laminated, in which the solder resist fills a portion in which the substrate core is penetrated, and the solder resist is not laminated to an external electrode positioning area on the bottom surface of the substrate core, and the solder resist laminated to the top surface of the substrate core is thickest in a center portion of the wiring substrate for use in the semiconductor apparatus on an inner area of the wiring substrate surrounded by the bonding pad positioning area, and forms a raised portion having a flat top surface.

Preferably, the substrate core is shaped as a flat plate and made of an insulating material.

Preferably, a via surface portion of the via which penetrates through the substrate core is copper-foil-plated so as to electrically connect between the conductor layer laminated to the top surface of the substrate core and the conductor layer laminated to the bottom surface of the substrate core.

Preferably, the center portion is a semiconductor chip mounting area.

Further, preferably, a thickness of the solder resist laminated to a half-etched area positioned between the bonding pad positioning area and the center portion is smaller than a thickness of the solder resist laminated to the center portion.

Furthermore, preferably, sides of the semiconductor chip mounting area are each at least 150 μm longer than a side of a semiconductor chip to be mounted.

In order to attain the object mentioned above, a method for fabricating a wiring substrate for use in a semiconductor apparatus according to the present invention comprises: a step of forming a via which penetrates between a top surface and a bottom surface of a substrate core, in which a conductor layer is laminated to each of the top surface and the bottom surface of the substrate core; a step of plating, with a copper foil, a surface of the via which penetrates through the substrate core; a step of etching a part of the conductor layer laminated to each of the top surface and the bottom surface of the substrate core, so as to form a wiring pattern; a step of laminating a solder resist to the top surface of the substrate core to which the conductor layer is laminated so as to pattern the substrate core such that the solder resist is thickest in a center portion of the substrate core, and forms, in the center portion of the substrate core, a raised portion having a flat top surface; a step of laminating the solder resist to the bottom surface of the substrate core to which the conductor layer is laminated so as to pattern the substrate core; a step of removing the solder resist from a bonding pad positioning area on the top surface of the substrate core; a step of removing the solder resist from an external electrode positioning area on the bottom surface of the substrate core; and a step of positioning a bonding pad in the bonding pad positioning area.

Preferably, the step of laminating the solder resist to the top surface of the substrate core includes a step of laminating the solder resist to the entire top surface of the substrate core so as to have a thickness of the raised portion to be formed; and a step of etching and removing, from the solder resist laminated to the entire top surface of the substrate core, a part of the solder resist laminated to a portion other than the center portion.

Further, preferably, the step of laminating the solder resist to the top surface of the substrate core includes a step of laminating the solder resist to the entire top surface of the substrate core so as to have a thickness lesser than a thickness of the raised portion to be formed; and a step of laminating the solder resist to the center portion at least twice.

Furthermore, preferably, the center portion is a semiconductor chip mounting area.

Moreover, the step of laminating the solder resist to the top surface of the substrate core includes a step of laminating the solder resist to the entire top surface of the substrate core so as to have a thickness of the raised portion to be formed, and a step of removing, by performing half-etching, a part of the solder resist laminated to a half-etched area positioned between the bonding pad positioning area and the center portion.

Further, preferably, the solder resist laminated to the substrate core is removed by using a chemical method.

Furthermore, preferably, the solder resist laminated to the substrate core is removed by using a mechanical method.

In order to attain the object mentioned above, a semiconductor apparatus according to the present invention comprises a semiconductor chip; a wiring substrate, for use in the semiconductor apparatus, having the semiconductor chip mounted thereon; an attaching component for connecting between the semiconductor chip and the wiring substrate for use in the semiconductor apparatus; a metal thin wire for electrically connecting between the semiconductor chip and the wiring substrate for use in the semiconductor apparatus; and a sealing resin for collectively sealing the semiconductor chip, the wiring substrate for use in the semiconductor apparatus, the attaching component, and the metal thin wire, and the wiring substrate for use in the semiconductor apparatus is the wiring substrate for use in the semiconductor apparatus described above.

As described above, in the wiring substrate for use in the semiconductor apparatus and the method for fabricating the wiring substrate for use in the semiconductor apparatus according to the present invention, unevenness of the semiconductor chip mounting area on the wiring substrate for use in the semiconductor apparatus is reduced, and therefore, when the semiconductor chip is mounted, generation of bubbles (voids) between the semiconductor chip and the wiring substrate for use in the semiconductor apparatus is suppressed, and the separation between the semiconductor chip and the wiring substrate for use in the semiconductor apparatus is prevented, thereby realizing the wiring substrate for use in the semiconductor apparatus and the method for fabricating the wiring substrate for use in the semiconductor apparatus having such a stable quality as described above.

In the wiring substrate for use in the semiconductor apparatus and the method for fabricating the wiring substrate for use in the semiconductor apparatus according to the present invention, unevenness of the semiconductor chip mounting area on the wiring substrate for use in the semiconductor apparatus is reduced, and therefore the separation between the semiconductor chip and the wiring substrate for use in the semiconductor apparatus is suppressed, so that the semiconductor apparatus having such a stable quality as described above, and the like, can be realized, and the semiconductor apparatus is applicable as a semiconductor apparatus for use in an electronic apparatus having its performance enhanced and its function diversified while having its size and thickness reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1A:
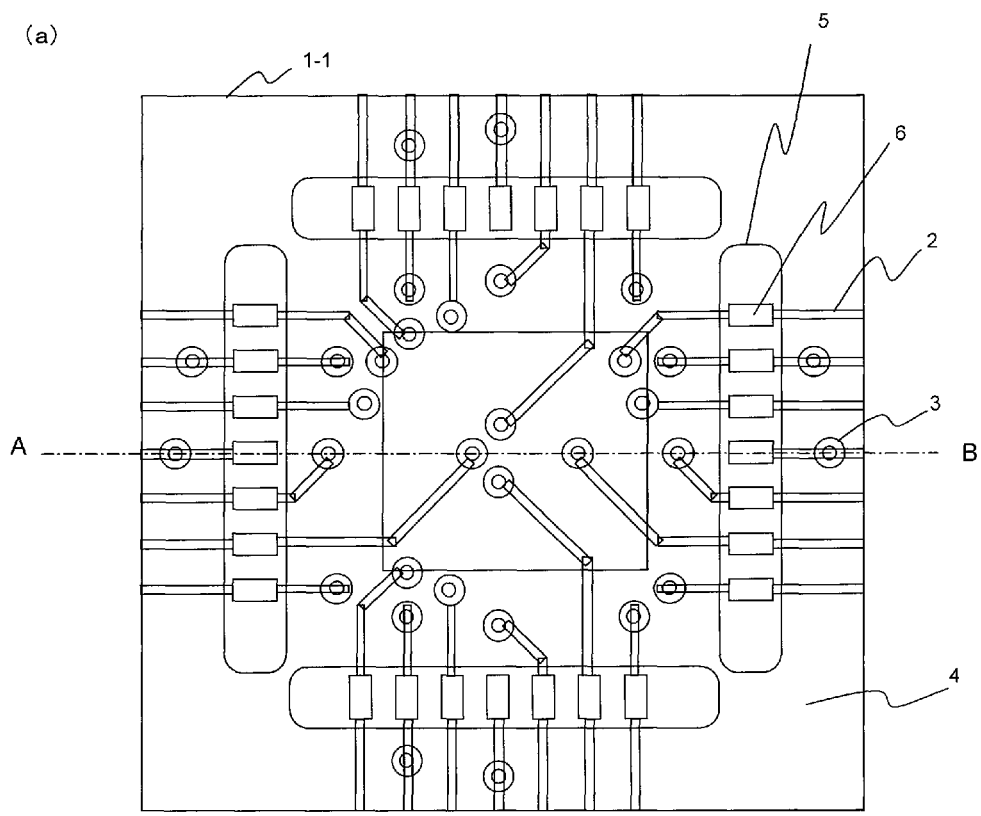
FIG. 1A is a diagram illustrating a printed-wiring board 1-1 according to a first embodiment of the present invention.
Figure 1A:
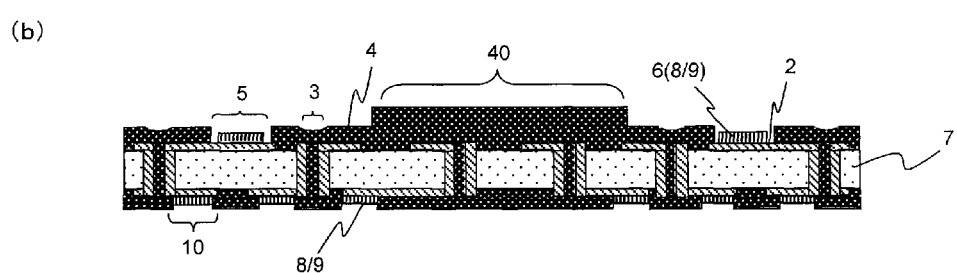

FIG. 1A is a diagram illustrating a printed-wiring board 1-1 which is a wiring substrate for use in a semiconductor apparatus according to a first embodiment of the present invention. FIG. 1A(a) is a top view of the printed-wiring board 1-1. In FIG. 1A(a), the printed-wiring board 1-1 is patterned with a conductor layer 2, and the conductor layer 2 is electrically connected through vias 3 to a conductor layer which is provided on the bottom surface of the printed-wiring board 1-1. On a bonding pad positioning area 5 of the printed-wiring board 1-1, a bonding pad 6 is positioned so as to connect to the conductor layer 2, and a surface portion of each of the bonding pad 6 and the conductor layer 2 is Ni/Au-plated. A solder resist 4 is applied to portions other than the bonding pad positioning area 5 of the printed-wiring board 1-1. A configuration of the top surface of the printed-wiring board 1-1 is the same as the configuration of the conventional printed-wiring board 101 shown in FIG. 11(*a*).

Figure 1B:
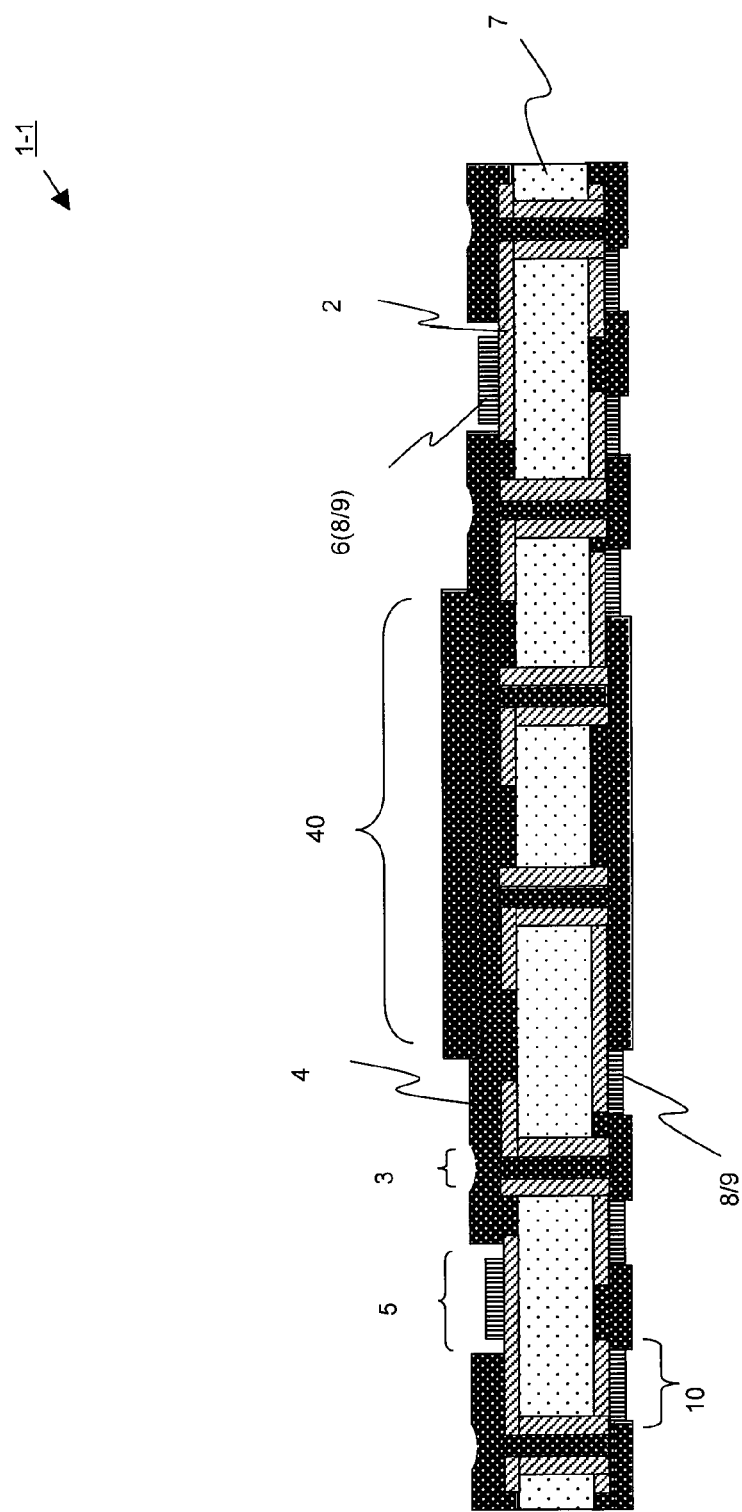
FIG. 1B is an enlarged cross-sectional view of the printed-wiring board 1-1 according to the first embodiment of the present invention.
Figure 11:
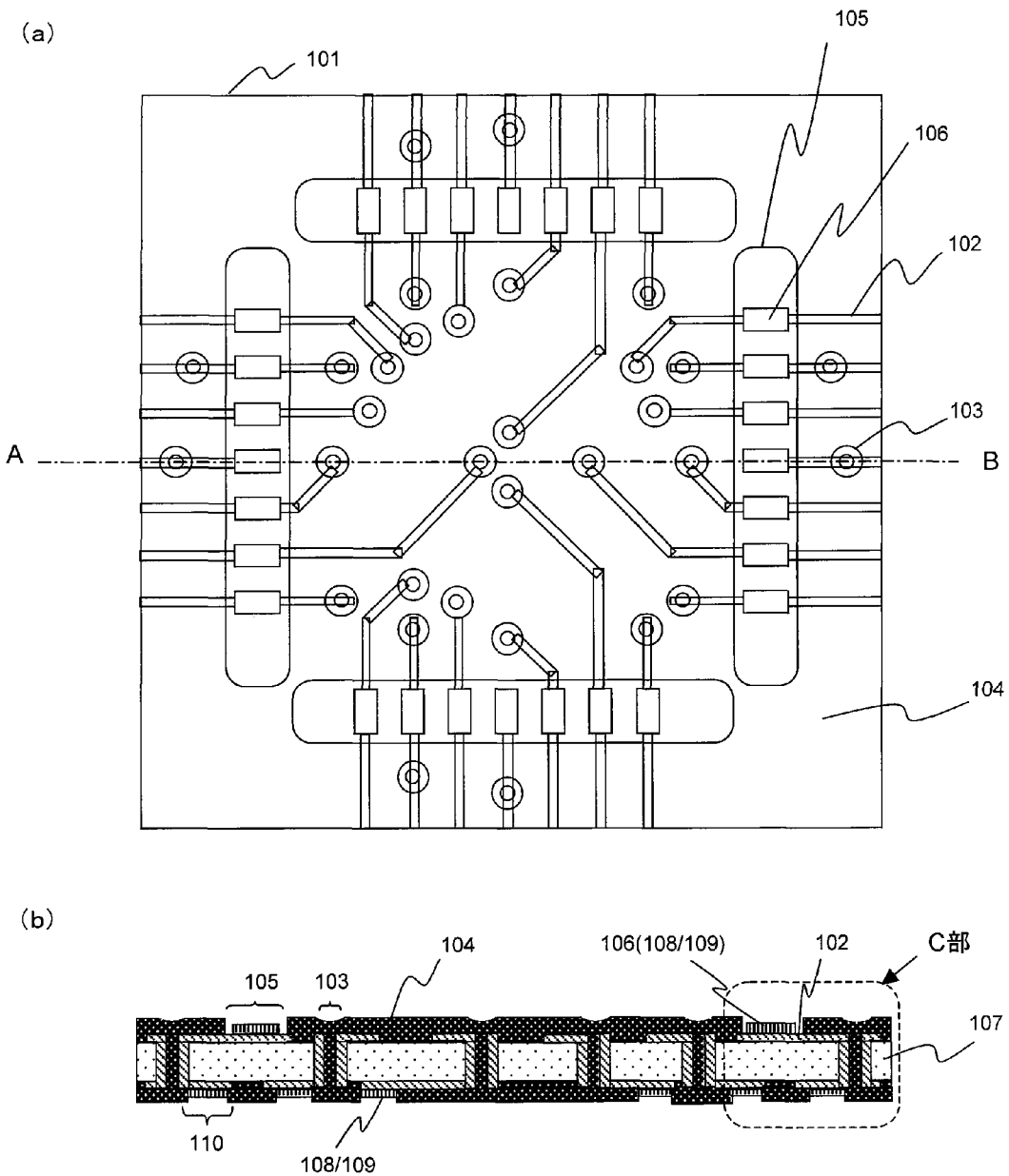
FIG. 11 is a diagram illustrating a printed-wiring board 101 according to a conventional art.
Figure 12:
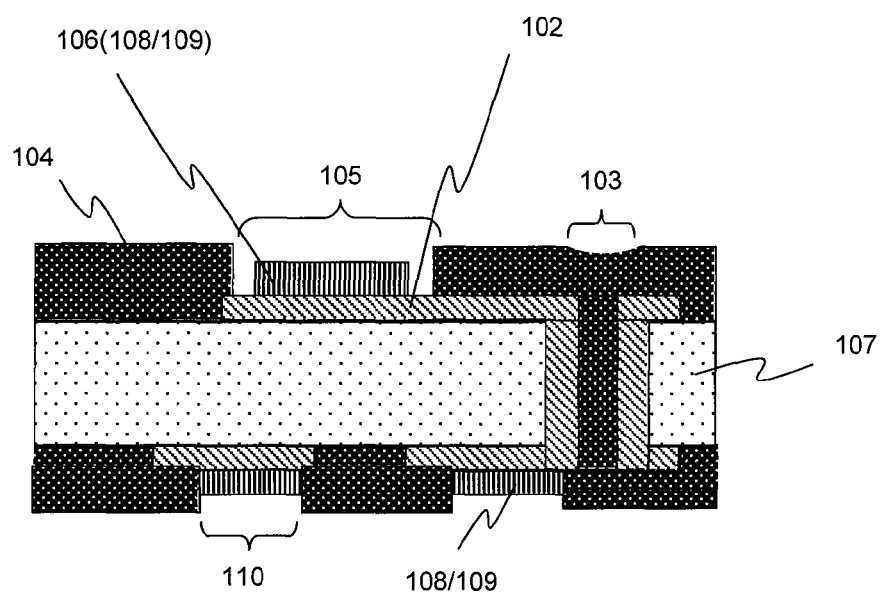
FIG. 12 is an enlarged view of a portion C of the printed-wiring board 101 according to the conventional art.
Figure 13:
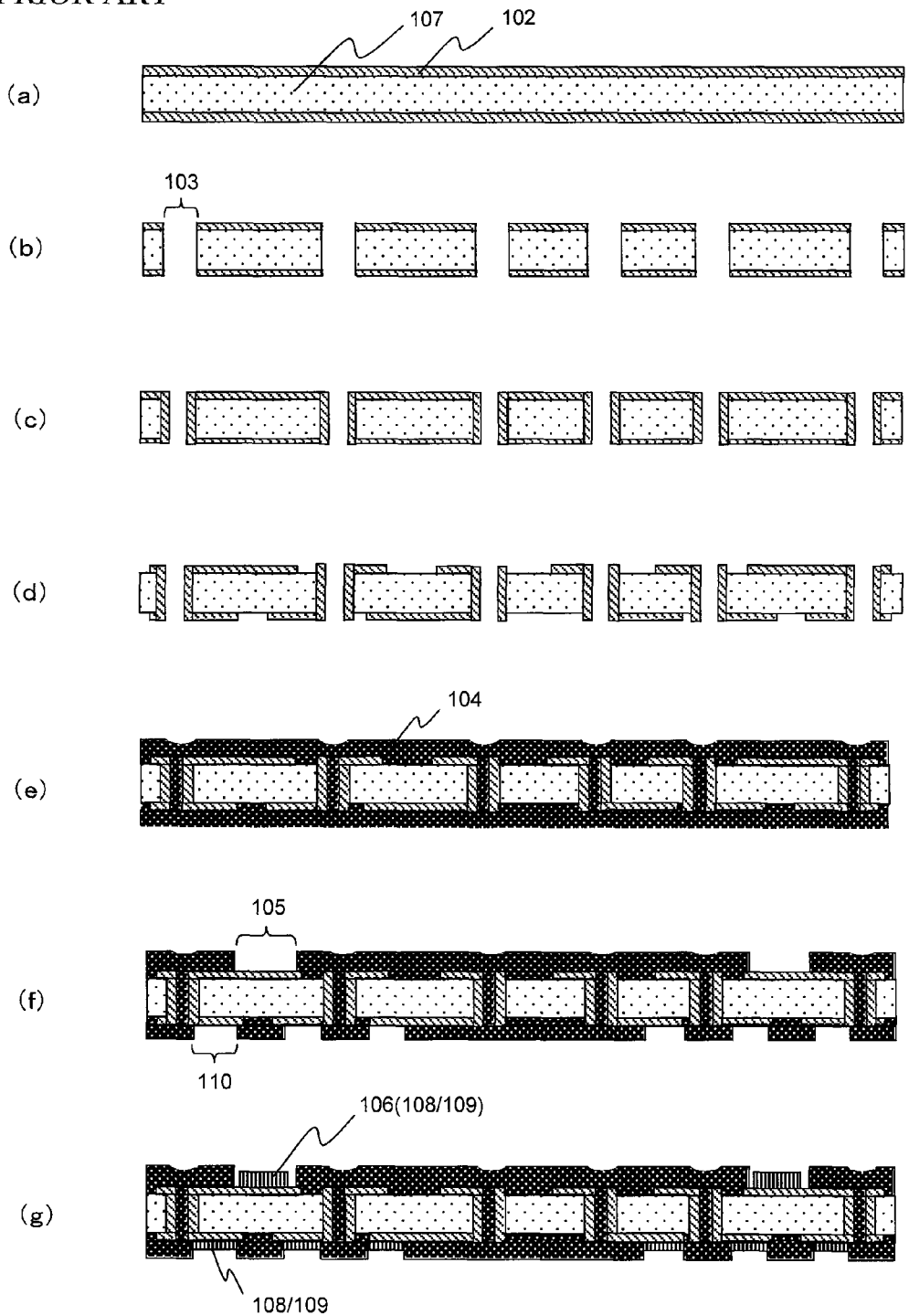
FIG. 13 is a diagram illustrating a method for fabricating the printed-wiring board 101 according to the conventional art.
Figure 14:
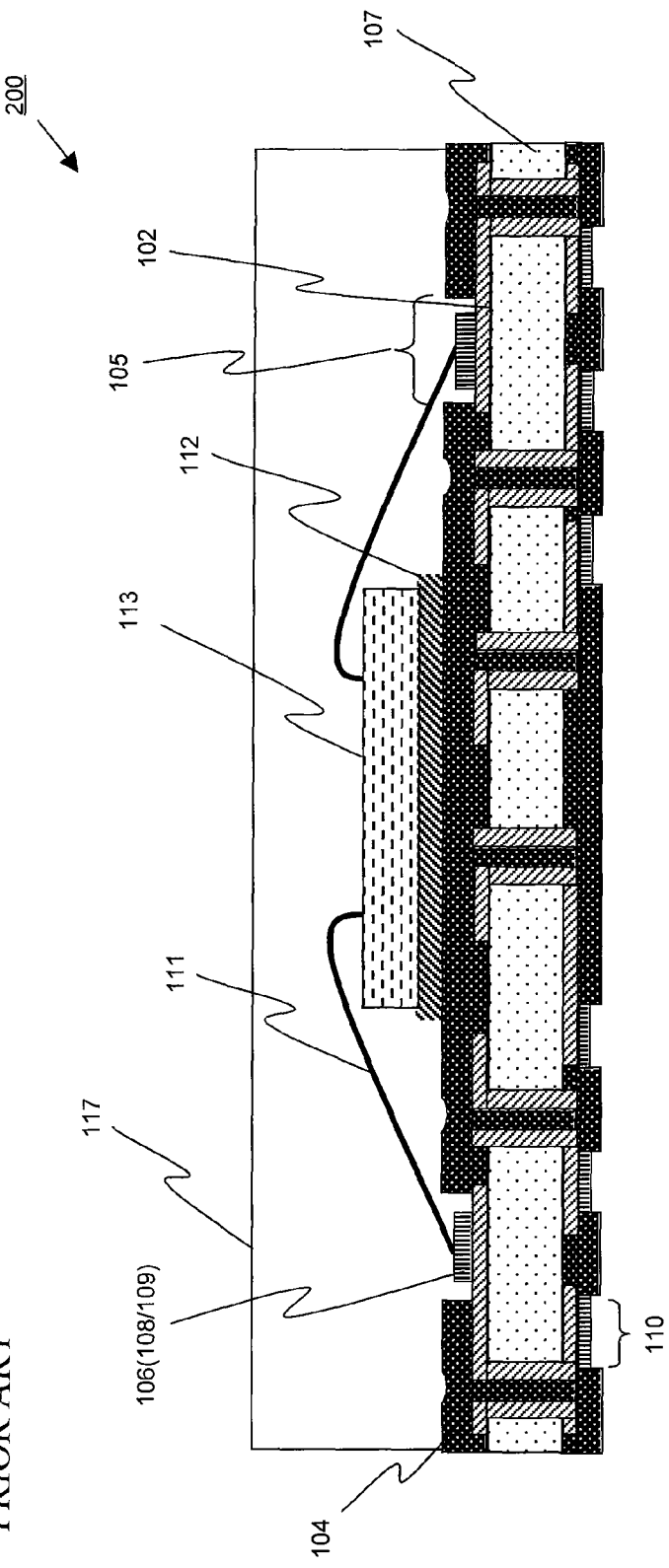
FIG. 14 is a diagram illustrating a semiconductor apparatus 200 using the printed-wiring board 101 according to the conventional art.

FIG. 1A(b) is a cross-sectional view of the printed-wiring board 1-1 shown in FIG. 1A(a) along lines A-B. FIG. 1B is an enlarged view of a cross section of the printed-wiring board 1-1 shown in FIG. 1A(b). In FIG. 1B, the conductor layer 2 with which the printed-wiring board 1-1 is patterned is laminated to both the top surface and the bottom surface of a substrate core 7. Further, the substrate core 7 has holes penetrating therethrough so as to form the vias 3. The surfaces of the vias 3 penetrating through the substrate core 7 are each copper-foil-plated, and therefore the conductor layer 2 provided on both the top and the bottom surfaces of the substrate core 7 are electrically connected to each other. The solder resist 4 is applied to portions other than the bonding pad positioning area 5 on the top surface of the printed-wiring board 1-1, and a ball positioning area 10 provided on the bottom surface of the printed-wiring board 1-1. The vias 3 in which the substrate core 7 has the copper-foil-plated surface are filled with the solder resist 4. The solder resist 4 has formed thereon a raised portion 40 at the center portion of the printed-wiring board 1-1 on the inner area of the printed-wiring board 1-1 surrounded by the bonding pad positioning area 5. That is, the thickness of the solder resist 4 applied to the center portion of the printed-wiring board 1-1 is greater than the solder resist 4 applied to portions other than the center portion thereof. The bonding pad 6 is positioned on the bonding pad positioning area 5 which is open, and the surface of the bonding pad 6 is Ni (8)/Au (9)-plated. Further, the surface of the conductor layer 2 in the ball positioning area 10 is Ni (8)/Au (9)-plated. As described above, the printed-wiring board 1-1 shown in FIG. 1A and FIG. 1B is different from the conventional printed-wiring board 101 as shown in FIG. 11 in that the printed-wiring board 1-1 has the raised portion 40 formed by the solder resist 4.

Figure 2:
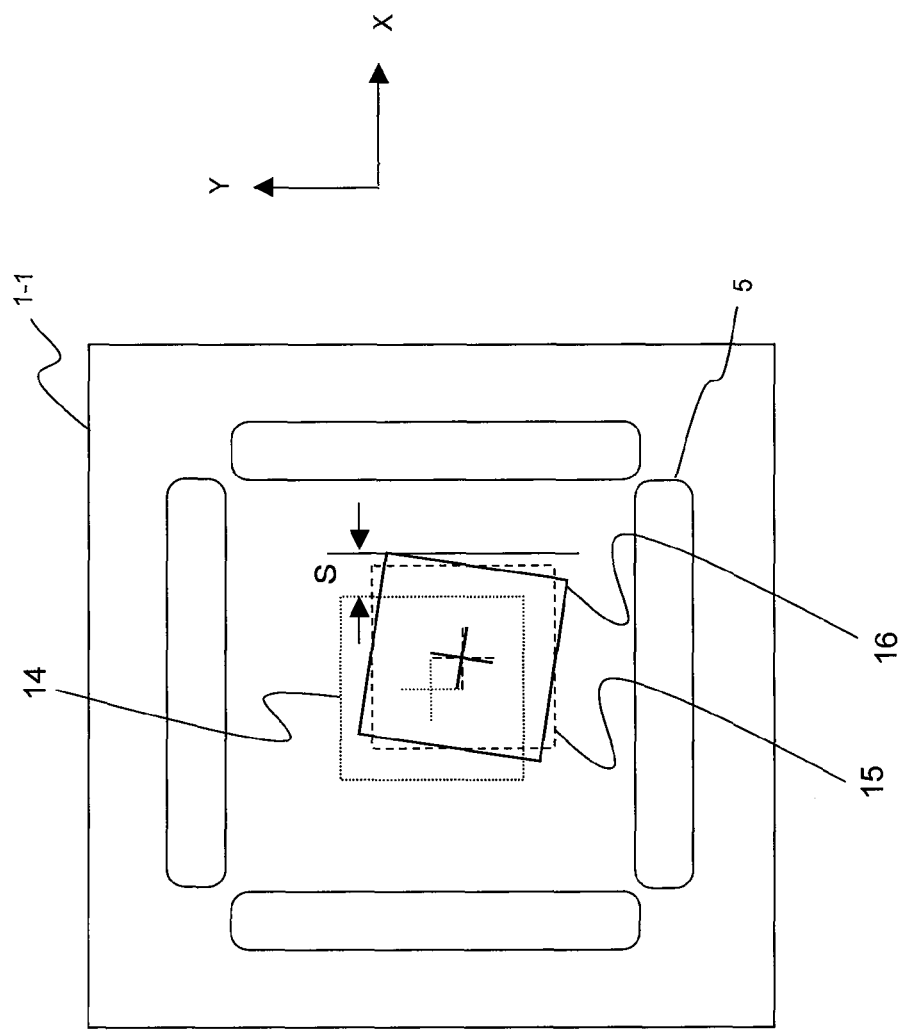
FIG. 2 is a diagram illustrating an area in which a semiconductor chip is mounted on the printed-wiring board 1-1 according to the first embodiment of the present invention.

A range in which the raised portion 40 is formed at the center portion of the printed-wiring board 1-1 by the solder resist 4 will be described below. FIG. 2 is a diagram illustrating an area (a semiconductor chip mounting area) in which the semiconductor chip is mounted on the printed-wiring board 1-1. In the printed-wiring board 1-1 shown in FIG. 2, an ideal position at which the semiconductor chip is mounted is the center (a semiconductor chip ideal mounting position area 14 shown in FIG. 2) of the printed-wiring board 1-1. In some cases, however, the semiconductor chip may be mounted in an area which deviates from the semiconductor chip ideal mounting position area 14, in a process of fabricating the semiconductor apparatus, due to variations in fabricated machines and the like. The deviation includes a parallel deviation and an angular deviation. The parallel deviation represents a state where the semiconductor chip deviates (a semiconductor-chip-mounting parallel deviation position 15 as shown in FIG. 2) from the semiconductor chip ideal mounting position area 14 so as to be parallel with the X direction and the Y direction of the printed-wiring board 1-1, whereas the angular deviation represents a state where the semiconductor chip deviates from the semiconductor chip ideal mounting position area 14 so as to be rotated (the semiconductor-chip-mounting deviation position 16 shown in FIG. 2) from the semiconductor-chip-mounting parallel deviation position 15 described above. At this time, based on an amount S of the largest deviation, each side of the semiconductor chip ideal mounting position area 14 is extended, thereby defining the semiconductor chip mounting area. Thus, the semiconductor chip mounting area obtained by the extension may be defined as a range of the raised portion 40 formed by the solder resist 4.

Specifically, for example, the parallel deviation represents a state where the semiconductor chip deviates by 100 μm in the X direction and deviates by 100 μm in the Y direction so as to be parallel with the X direction and the Y direction, and further the angular deviation represents a state where the semiconductor chip is rotated clockwise at one degree from the parallel deviation. In this case, the amount S of deviation is about 150 μm although the amount S of deviation depends on the size of the semiconductor chip. Each side of the semiconductor chip ideal mounting position area 14 is extended by about 150 μm corresponding to the amount S of deviation, thereby defining the semiconductor chip mounting area. As described above, the solder resist 4 is thickly applied to the semiconductor chip mounting area obtained by extending each side of the semiconductor chip ideal mounting position area 14 by about 150 μm, thereby forming the raised portion 40.

Figure 3:
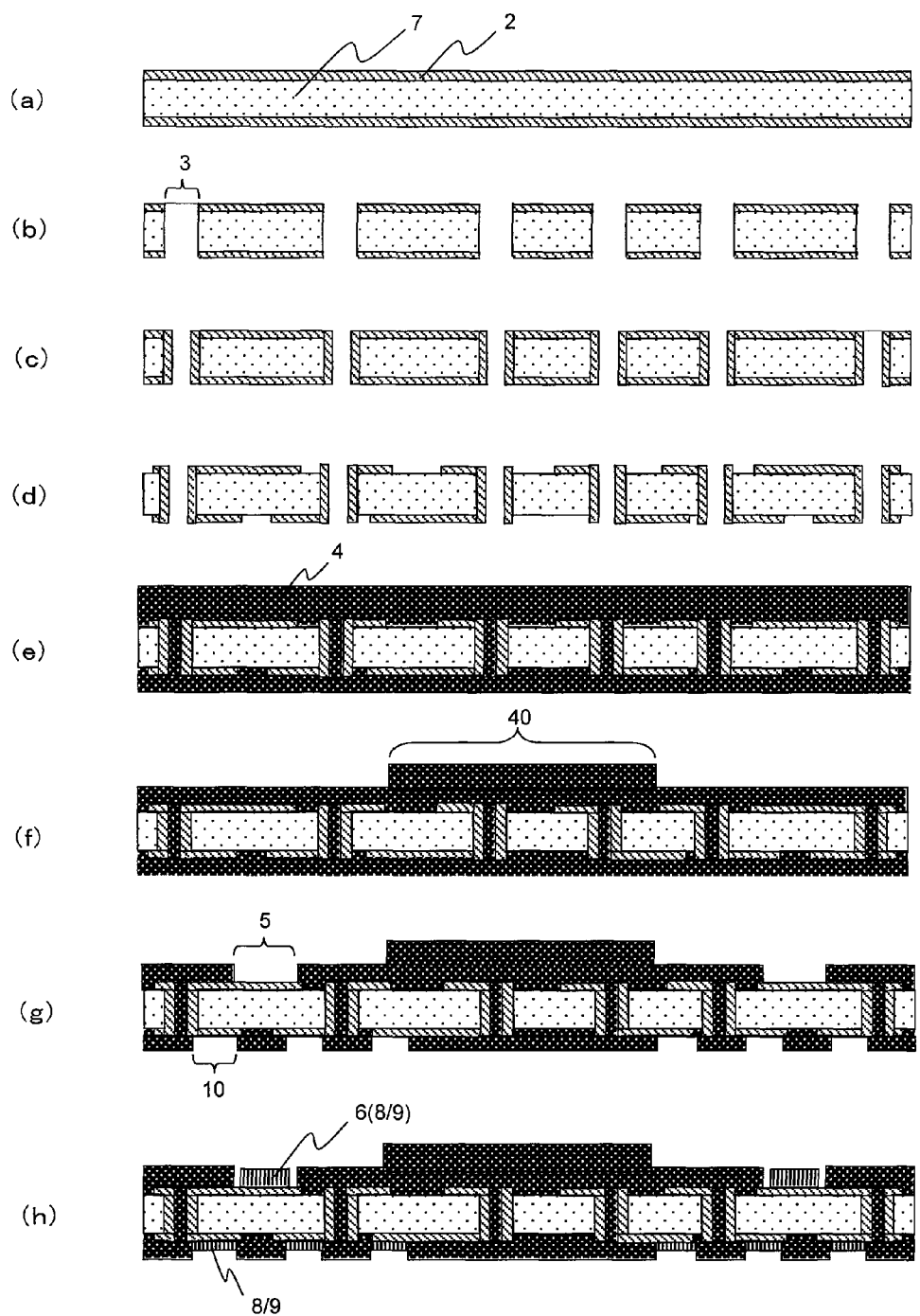
FIG. 3 is a diagram illustrating a method for fabricating the printed-wiring board 1-1 according to the first embodiment of the present invention.

Next, a method for fabricating the wiring substrate for use in the semiconductor apparatus according to the first embodiment of the present invention will be described. FIG. 3 is a diagram illustrating a method for fabricating the printed-wiring board 1-1 shown in FIG. 1A. FIGS. 3(*a*) to 3(*h*) are diagrams illustrating cross sections of the printed-wiring board 1-1 in fabrication process steps (a) to (h), respectively.

In a process step (a), the conductor layer 2 is laminated to the entire top surface and bottom surface of the substrate core 7. In a process step (b), the substrate core 7 having the top surface and the bottom surface to which the conductor layer 2 is laminated is penetrated at a predetermined portion (for example, 6 portions in FIG. 3) by means of a drill, a laser, or the like, thereby forming the vias 3. In a process step (c), the surface of each of the vias 3 penetrating through the substrate core 7 is copper-foil-plated. In a process step (d), a part of the conductor layer 2 laminated to both the top surface and the bottom surface of the substrate core 7 is etched and removed, so as to form a wiring pattern. In a process step (e), the solder resist 4 is applied to both the top surface and the bottom surface of the substrate core 7 to which the conductor layer 2 is laminated so as to pattern the substrate core 7. The solder resist 4 applied to the top surface of the substrate core 7 has such a thickness as to prevent the surface of the solder resist 4 from being uneven due to the vias and wirings. That is, if the thickness of the solder resist 4 is about 30 μm as described in the conventional art, the thickness of the solder resist 4 is too small. Further, the vias 3 in which the substrate core 7 has copper-foil-plated surface are each filled with the solder resist 4. In a process step (f), a part of the solder resist 4 is polished and removed in areas other than the semiconductor chip mounting area described above, so as to form the raised portion 40. In a process step (g), the solder resist 4 is etched and removed in the bonding pad positioning area 5 on the top surface of the printed-wiring board 1-1 and the ball positioning area 10 on the bottom surface of the printed-wiring board 1-1. In a process step (h), the bonding pad 6 is positioned on the surface of the conductor layer 2 exposed in the bonding pad positioning area 5, and the bonding pad 6 is Ni (8)/Au (9)-plated. Further, the surface of the conductor layer 2 exposed in the ball positioning area 10 is Ni (8)/Au (9)-plated.

Figure 4:
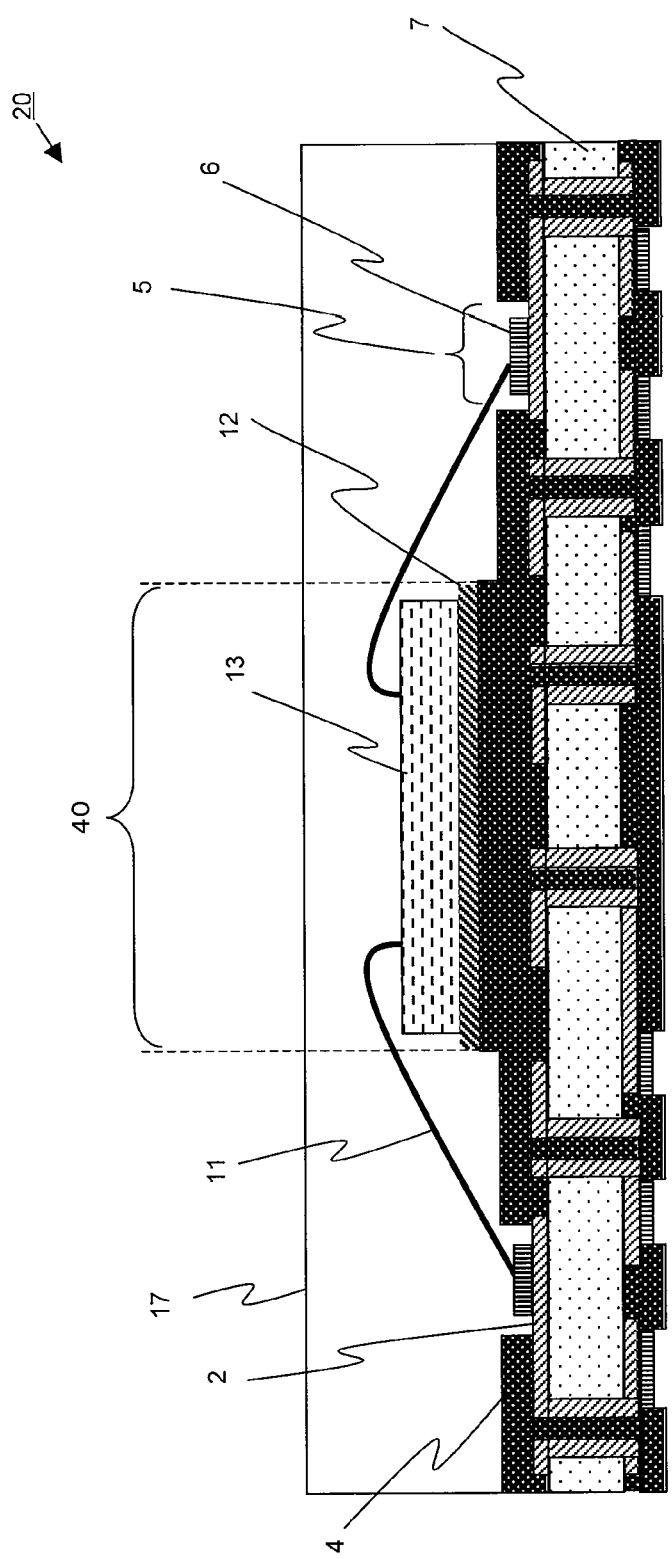
FIG. 4 is a diagram illustrating a semiconductor apparatus 20 using the printed-wiring board 1-1 according to the first embodiment of the present invention.

Next, an exemplary semiconductor apparatus using the printed-wiring board 1-1 shown in FIG. 1A and FIG. 3 will be described. FIG. 4 is a diagram illustrating a semiconductor apparatus 20 using the printed-wiring board 1-1. In FIG. 4, components which are the same or correspond to those shown in FIG. 1A and FIG. 3 are denoted by the same corresponding reference numerals, and the description thereof is not given.

In the raised portion 40 which is formed, as the semiconductor chip mounting area on the top surface of the printed-wiring board 1-1, by thickening the solder resist 4, the semiconductor chip 13 is adhered to the solder resist 4 by using a paste 12. An Au wire 11 which is a metal thin wire electrically connected to an electrode pad (not shown) on the semiconductor chip 13 is connected to the bonding pad 6 in the bonding pad positioning area 5. Thus, the semiconductor chip 13 and the bonding pad 6 are electrically connected to each other. Further, the semiconductor chip 13, the printed-wiring board 1-1, the paste 12, and the Au wire 11 are collectively sealed in a sealing resin 17.

As described above, in the semiconductor chip mounting area, the solder resist 4 is thickly applied to the top surface of the printed-wiring board 1-1, so that indentations of the vias 3 are fully filled with the solder resist 4. As a result, formation of the indentations on the surface of the solder resist 4 is suppressed in the semiconductor chip mounting area. Therefore, when the semiconductor chip 13 is mounted, it is difficult to generate bubbles (voids) between the solder resist 4 and the paste 12 or between the paste 12 and the semiconductor chip 13, and separation between the solder resist 4 and the paste 12 or between the paste 12 and the semiconductor chip 13 can be suppressed. Further, the solder resist 4 is thickly applied to the entire top surface of the printed-wiring board 1-1, and thereafter the solder resist 4 in areas other than the semiconductor chip mounting area is removed, and contact between the Au wire 11 and the solder resist 4 can be prevented.

As described above, according to the first embodiment of the present invention, in the wiring substrate for use in the semiconductor apparatus and the method for fabricating the wiring substrate, the raised portion having the solder resist thickened is formed in the semiconductor chip mounting area, and therefore unevenness in the semiconductor chip mounting area on the wiring substrate for use in the semiconductor apparatus can be reduced, and, when the semiconductor chip is mounted, generation of bubbles (voids) between the semiconductor chip and the wiring substrate for use in the semiconductor apparatus is suppressed, and separation between the semiconductor chip and the wiring substrate for use in the semiconductor apparatus can be prevented, thereby realizing the wiring substrate for use in the semiconductor apparatus having such a stable quality as described above.

Second Embodiment

Figure 5:
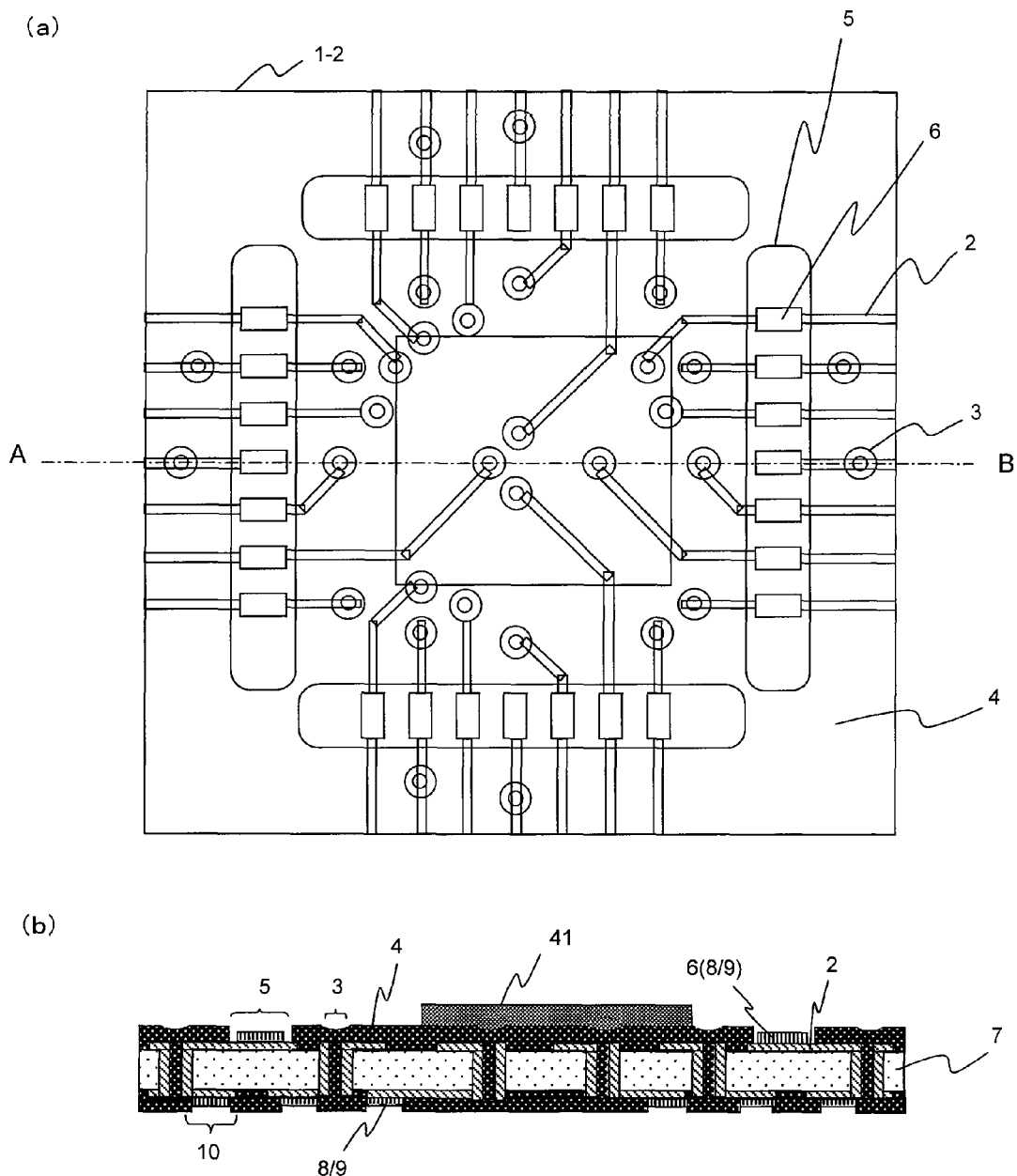
FIG. 5 is a diagram illustrating a printed-wiring board 1-2 according to a second embodiment of the present invention.

FIG. 5 is a diagram illustrating a printed-wiring board 1-2 which is a wiring substrate for use in a semiconductor apparatus according to a second embodiment of the present invention. FIG. 5(a) is a top view of the printed-wiring board 1-2, and FIG. 5(b) is a cross-sectional view of the printed-wiring board 1-2 shown in FIG. 5(a) along lines A-B. A configuration of the printed-wiring board 1-2 is almost the same as the configuration of the printed-wiring board 1-1 according to the first embodiment of the present invention, and, in FIG. 5, components which are the same or correspond to those shown in FIG. 1A are denoted by the same corresponding reference numerals, and the description thereof is not given. In the present embodiment, difference between the printed-wiring board 1-2 and the printed-wiring board 1-1 will be described in detail.

As shown in FIG. 1A, in the printed-wiring board 1-1 according to the first embodiment of the present invention, the solder resist 4 forms the raised portion 40 in the semiconductor chip mounting area of the printed-wiring board 1-1. On the other hand, as shown in FIG. 5, in the printed-wiring board 1-2 according to the second embodiment of the present invention, a portion corresponding to the raised portion 40 shown in FIG. 1A is formed by a second solder resist 41 which is formed in a process step other than the process step for forming the solder resist 4. An area in which the second solder resist is applied is the same as the semiconductor chip mounting area as shown in FIG. 2.

Figure 6:
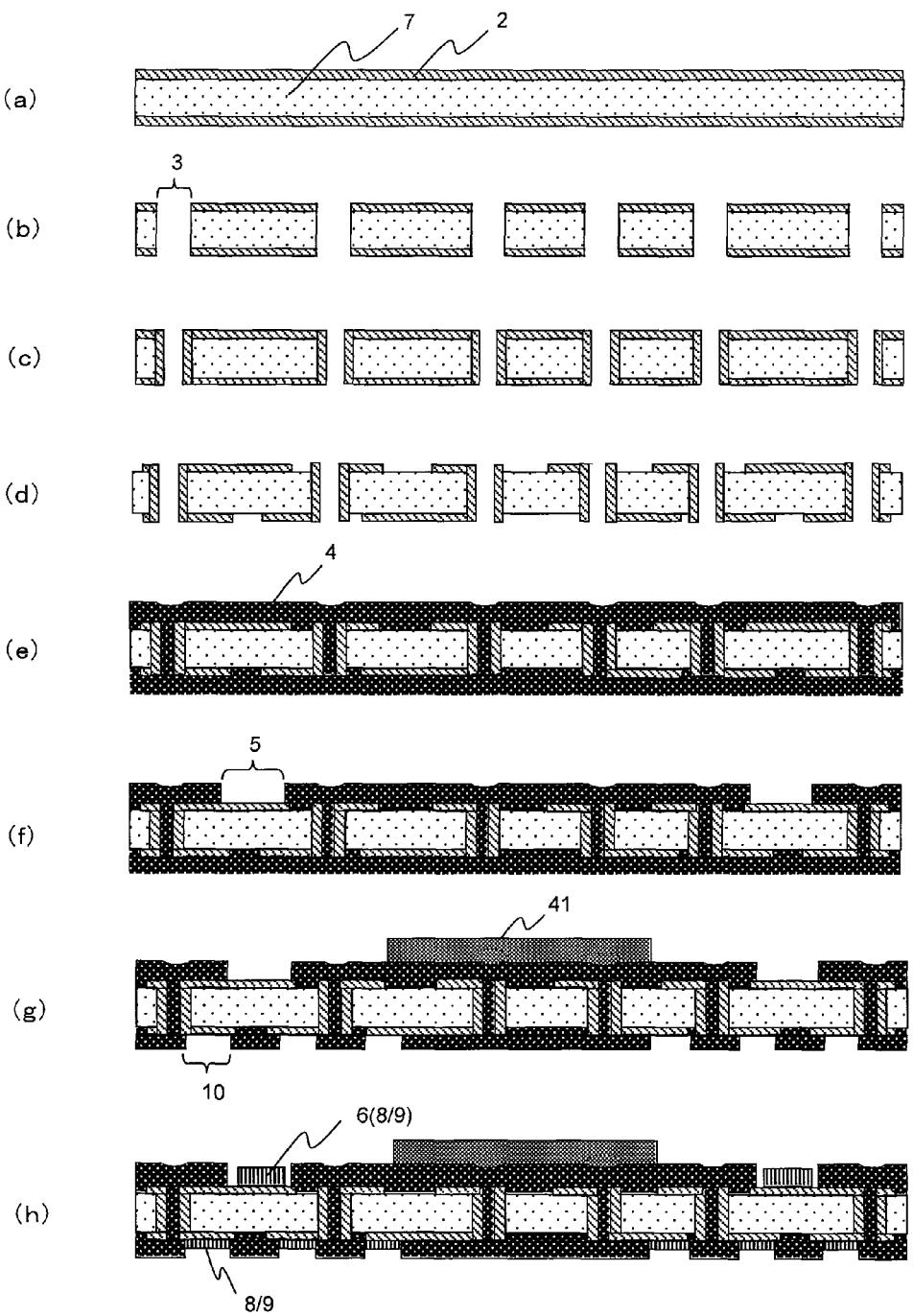
FIG. 6 is a diagram illustrating a method for fabricating the printed-wiring board 1-2 according to the second embodiment of the present invention.

Next, a method for fabricating the wiring substrate for use in the semiconductor apparatus according to the second embodiment of the present invention will be described. FIG. 6 is a diagram illustrating a method for fabricating the printed-wiring board 1-2 shown in FIG. 5. FIGS. 6(a) to 6(h) are diagrams illustrating cross sections of the printed-wiring board 1-2 in fabrication process steps (a) to (h), respectively. The process steps (a) to (d) are the same as the respective process steps (a) to (d), shown in FIG. 3, according to the first embodiment of the present invention, and the description thereof is not given. The process step (e) and the subsequent process steps will be described.

In a process step (e), the solder resist 4 is applied to both the top and the bottom surfaces of the substrate core 7 to which the conductor layer 2 is laminated so as to pattern the substrate core 7. The solder resist 4 laminated to the substrate core 7 need not have such a thickness as to prevent the surface of the solder resist 4 from being uneven due to the vias and wirings, unlike in the process step (e), shown in FIG. 3, according to the first embodiment of the present invention, and the surface of the solder resist 4 may be uneven due to the vias and the wiring as described in the conventional art. Further, the vias 3 in which the substrate core 7 has the copper-foil-plated surface are filled with the solder resist 4. In a process step (f), the solder resist 4 in the bonding pad positioning area 5 on the top surface of the printed-wiring board 1-2 is etched and removed. In a process step (g), the second solder resist 41 is laminated to the solder resist 4 in the semiconductor chip mounting area on the top surface of the printed-wiring board 1-2 to which the solder resist 4 is laminated. Even when, in the semiconductor chip mounting area, an amount of the solder resist 4 laminated is small, and the surface is uneven due to the vias and the wirings, the surface becomes flat since the second solder resist 41 is laminated. Further, the solder resist 4 in the ball positioning area 10 on the bottom surface of the printed-wiring board 1-2 is etched and removed. In a process step (h), the bonding pad 6 is positioned on the surface of the conductor layer 2 exposed in the bonding pad positioning area 5, and the bonding pad 6 is Ni (8)/Au (9)-plated. Further, the surface of the conductor layer 2 exposed in the ball positioning area 10 is Ni (8)/Au (9)-plated.

Figure 7:
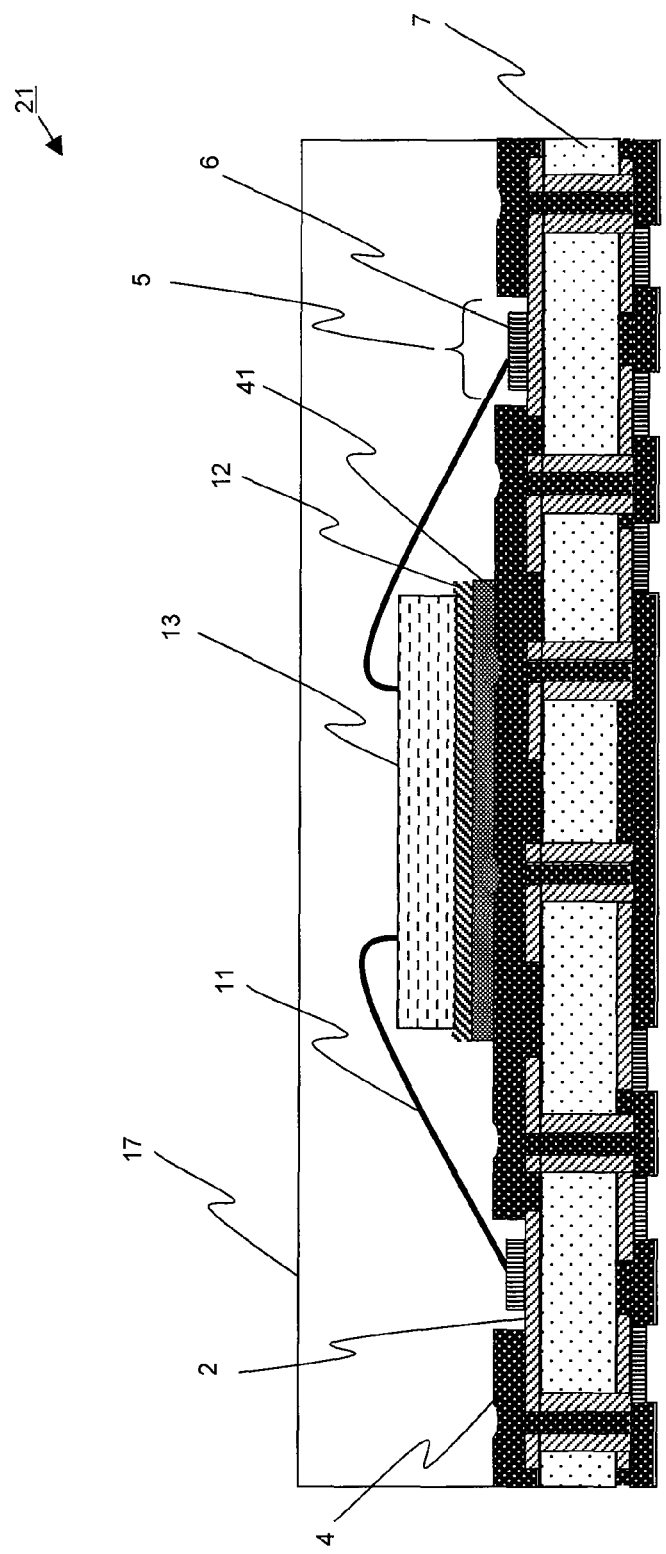
FIG. 7 is a diagram illustrating a semiconductor apparatus 21 using the printed-wiring board 1-2 according to the second embodiment of the present invention.

Next, an exemplary semiconductor apparatus using the printed-wiring board 1-2 shown in FIGS. 5 and 6 will be described. FIG. 7 is a diagram illustrating a semiconductor apparatus 21 using the printed-wiring board 1-2. In FIG. 7, components which are the same or correspond to those shown in FIGS. 5 and 6 are denoted by the same corresponding reference numerals, and the description thereof is not given.

As described above, the second solder resist 41 is laminated, in the semiconductor chip mounting area, to the solder resist 4 which is also laminated to the top surface of the printed-wiring board 1-2. Therefore, the semiconductor chip 13 is adhered to the second solder resist 41 by using the paste 12. The Au wire 11 which is a metal thin wire electrically connected to the electrode pad (not shown) on the semiconductor chip 13 is connected to the bonding pad 6 in the bonding pad positioning area 5. Thus, the semiconductor chip 13 and the bonding pad 6 are electrically connected to each other. Further, the semiconductor chip 13, the printed-wiring board 1-2, the paste 12, and the Au wire 11 are collectively sealed in the sealing resin 17.

As described above, the second solder resist 41 is laminated, in the semiconductor chip mounting area, to the solder resist 4 which is also laminated to the top surface of the printed-wiring board 1-2, and therefore the indentations of the vias 3 are filled with the second solder resist 41. As a result, formation of the indentations on the surface of the solder resist 4 is suppressed in the semiconductor chip mounting area. Therefore, when the semiconductor chip 13 is mounted, it is difficult to generate bubbles (voids) between the second solder resist 41 and the paste 12 or between the paste 12 and the semiconductor chip 13, and separation between the second solder resist 41 and the paste 12 or between the paste 12 and the semiconductor chip 13 can be suppressed. Further, the second solder resist 41 is applied to not the entire top surface of the printed-wiring board 1-2 but only an area in which the semiconductor chip 13 is mounted, thereby preventing contact between the Au wire 11 and the solder resist 4.

As described above, in the wiring substrate for use in the semiconductor apparatus and the method for fabricating the wiring substrate according to the second embodiment of the present invention, the second solder resist is laminated, in the semiconductor chip mounting area, to the top surface of the printed-wiring board to which the solder resist is laminated, and therefore unevenness in the semiconductor chip mounting area on the wiring substrate for use in the semiconductor apparatus can be reduced, and, when the semiconductor chip is mounted, generation of bubbles (voids) between the semiconductor chip and the wiring substrate for use in the semiconductor apparatus is suppressed, and separation between the semiconductor chip and the wiring substrate for use in the semiconductor apparatus can be prevented, thereby realizing the wiring substrate for use in the semiconductor apparatus having such a stable quality as described above.

The wiring substrate for use in the semiconductor apparatus according to the second embodiment of the present invention is fabricated by applying the second solder resist 41 in an individual separate process step as shown in FIG. 6. Therefore, in the wiring substrate for use in the semiconductor apparatus according to the second embodiment of the present invention, an amount of solder resist used in a process for fabricating the wiring substrate for use in the semiconductor apparatus can be reduced as compared to the wiring substrate for use in the semiconductor apparatus, according to the first embodiment of the present invention, which is fabricated by etching and removing an unnecessary portion of the solder resist 4 which has been thickly applied. As described above, there is an advantage that the wiring substrate for use in the semiconductor apparatus can be fabricated at reduced cost.

However, the formation of the second solder resist 41 is not limited to the formation using a method for applying the second solder resist 41 to the semiconductor chip mounting area only. For example, as described in the first embodiment of the present invention, the second solder resist 41 is applied to the entire top surface of the printed-wiring board, and thereafter the second solder resist 41 in portions other than the semiconductor chip mounting area may be etched and removed.

Third Embodiment

Figure 8:
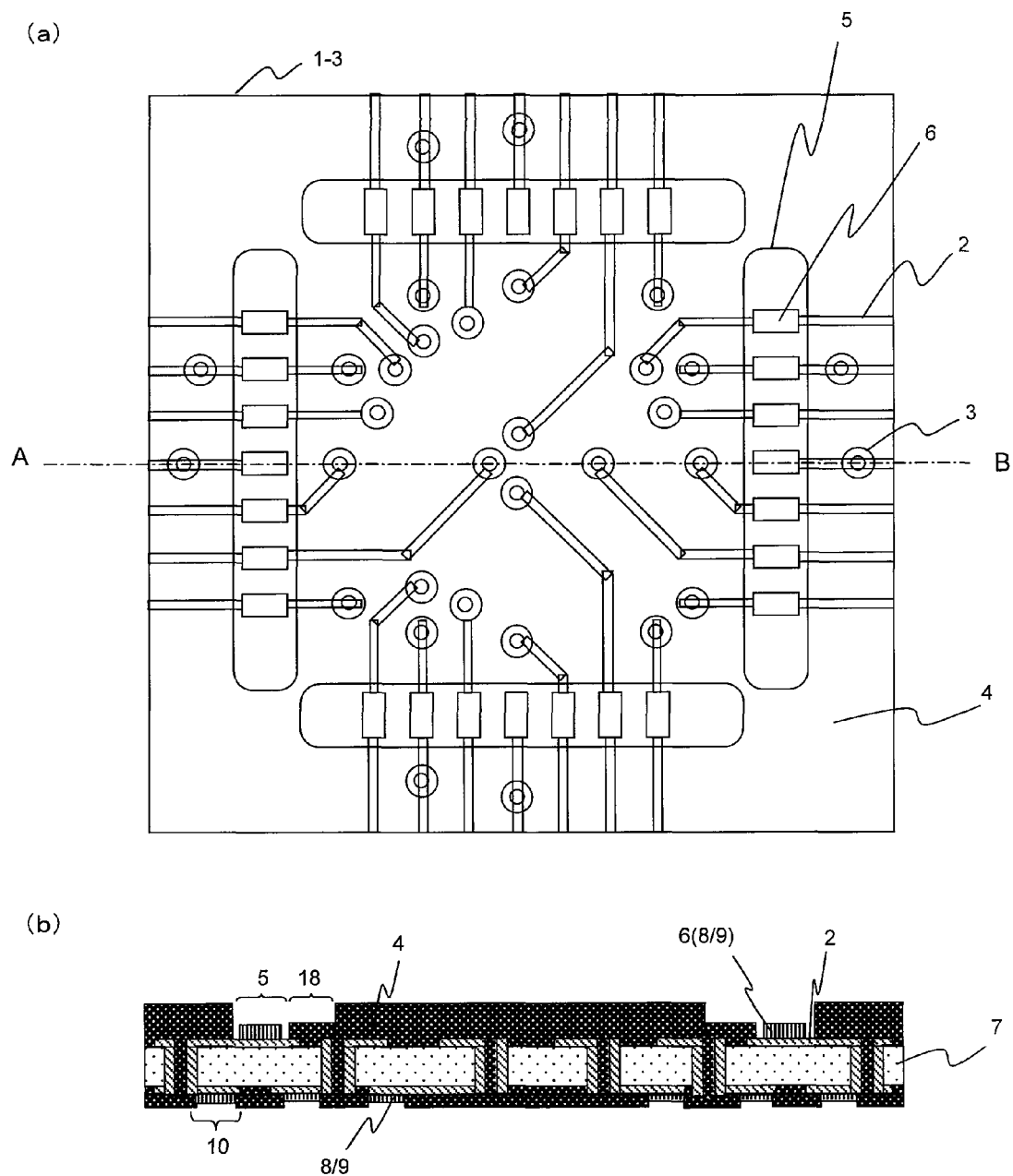
FIG. 8 is a diagram illustrating a printed-wiring board 1-3 according to a third embodiment of the present invention.

FIG. 8 is a diagram illustrating a printed-wiring board 1-3 which is a wiring substrate for use in the semiconductor apparatus according to a third embodiment of the present invention. FIG. 8(*a*) is a top view of the printed-wiring board 1-3, and FIG. 8(*b*) is a cross-sectional view of the printed-wiring board 1-3 shown in FIG. 8(*a*) along lines A-B. A configuration of the printed-wiring board 1-3 is almost the same as each of the configuration of the printed-wiring board 1-1 according to the first embodiment of the present invention and the configuration of the printed-wiring board 1-2 according to the second embodiment of the present invention, and, in FIG. 8, components which are the same or correspond to those shown in FIG. 1A and FIG. 5 are denoted by the same corresponding reference numerals, and the description thereof is not given. In FIG. 8(*b*), the printed-wiring board 1-3 is different from the printed-wiring board 1-1 and the printed-wiring board 1-2 in that the printed-wiring board 1-3 has a half-etched area 18 formed thereon. In the present embodiment, difference between the printed-wiring board 1-3 and the printed-wiring boards 1-1 and 1-2 will be described in detail.

Figure 9:
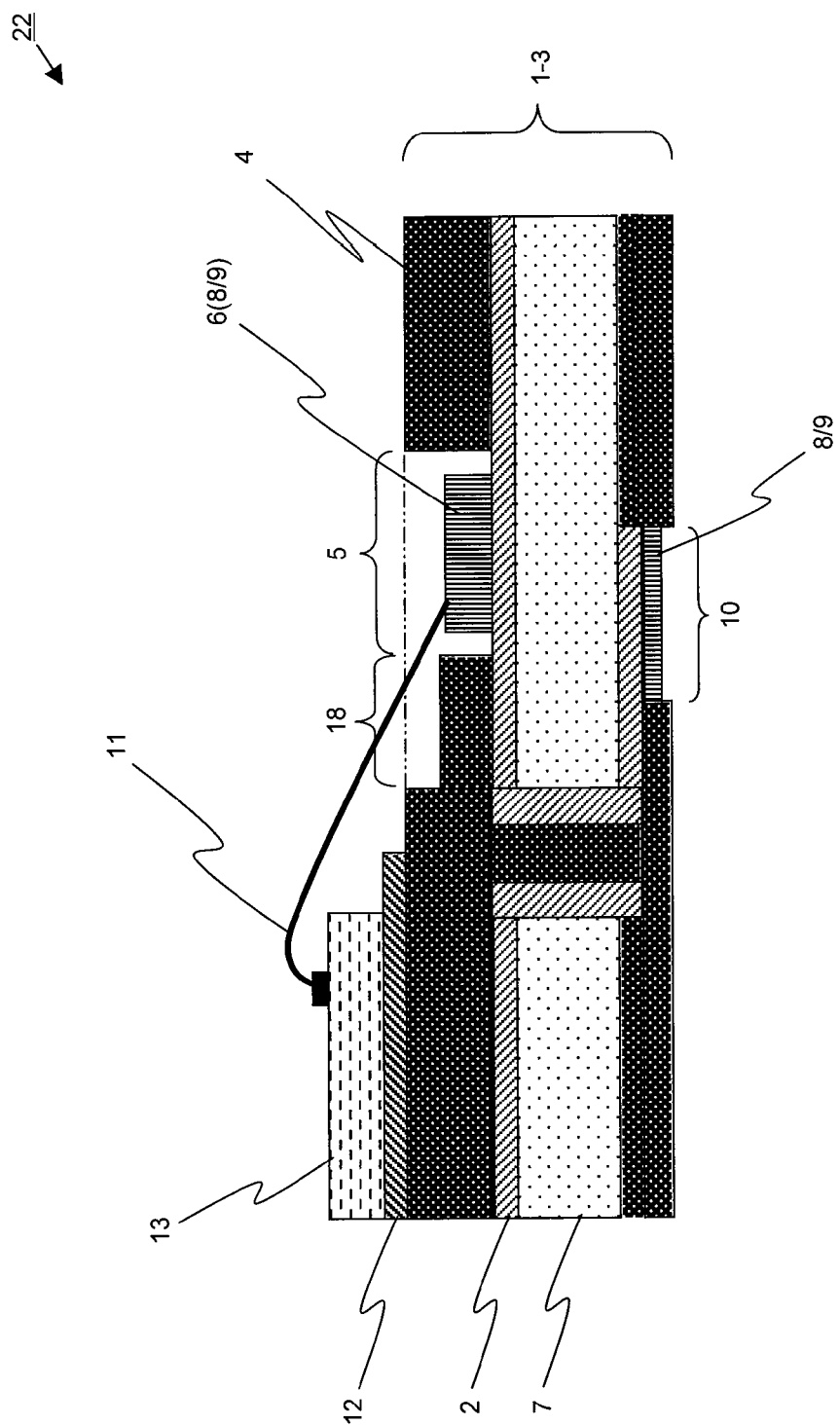
FIG. 9 is a diagram illustrating a part of a cross section of a semiconductor apparatus 22 using the printed-wiring board 1-3 according to the third embodiment of the present invention.

FIG. 9 is a diagram illustrating a part of a cross section of a semiconductor apparatus 22 using the printed-wiring board 1-3 according to the third embodiment of the present invention. The semiconductor chip 13 is adhered, by using the paste 12, to the solder resist 4 applied to the top surface of the printed-wiring board 1-3. The Au wire 11 which is a metal thin wire electrically connected to the electrode pad on the semiconductor chip 13 is connected to the bonding pad 6 in the bonding pad positioning area 5. Thus, the semiconductor chip 13 and the bonding pad 6 are electrically connected to each other. The solder resist 4 is applied to the top surface of the printed-wiring board 1-3 in areas other than the bonding pad positioning area 5, as in the printed-wiring boards 1-1 and 1-2 according to the first and the second embodiments, respectively, of the present invention. The printed-wiring board 1-3 according to the present embodiment further has the half-etched area 18 formed in a portion (closest to an area in which the semiconductor chip 13 is mounted) which is closest to the center of the printed-wiring board 1-3 among portions bordering a resist opening of the bonding pad positioning area 5. Although the solder resist 4 is laminated to the top surface of the printed-wiring board 1-3 in the half-etched area 18, the thickness of the solder resist 4 laminated to the top surface of the printed-wiring board 1-3 in the half-etched area 18 is lesser than the thickness of the solder resist 4 laminated to the top surface of the printed-wiring board 1-3 in portions other than the half-etched area 18.

Figure 10:
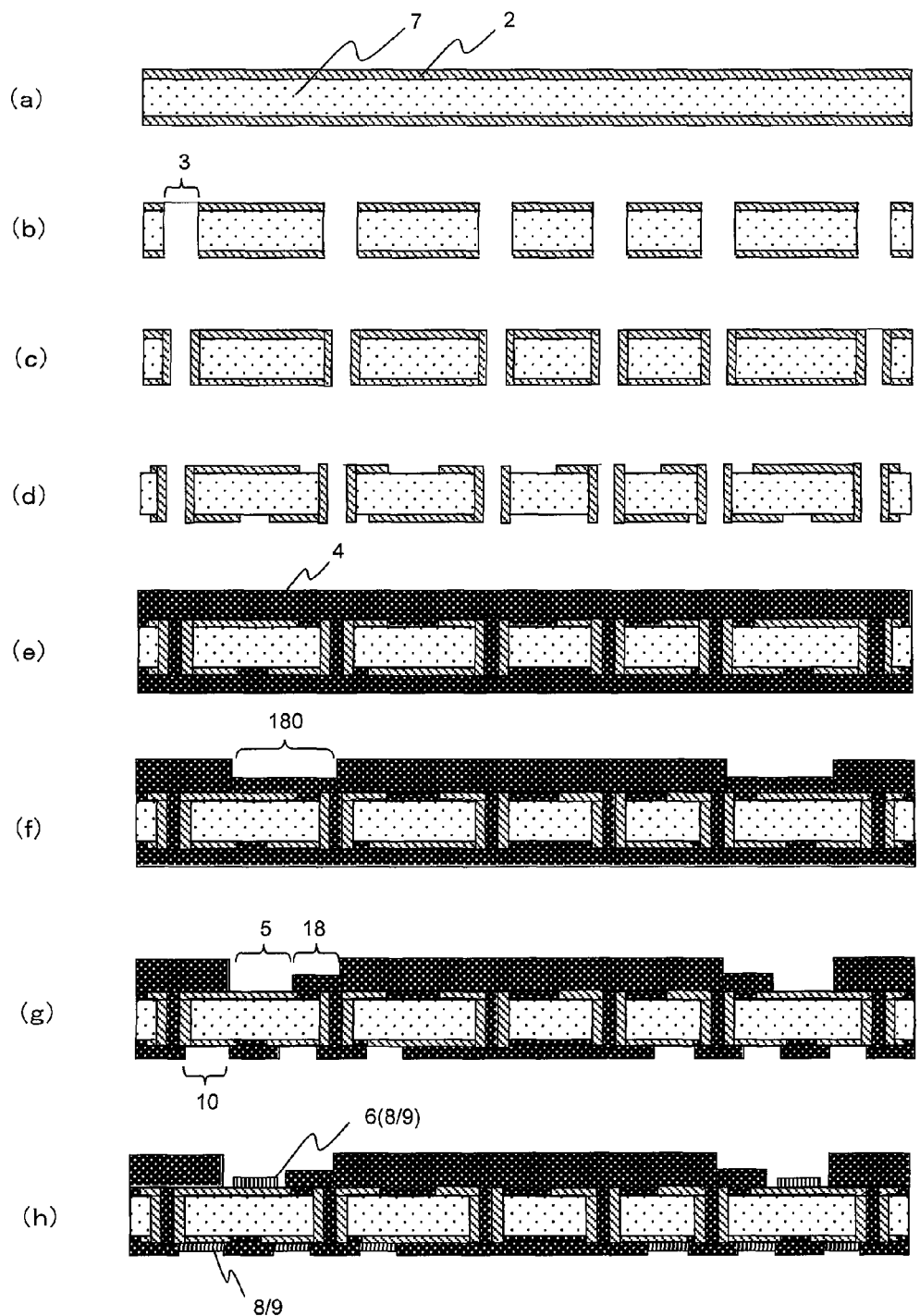
FIG. 10 is a diagram illustrating a method for fabricating the printed-wiring board 1-3 according to the third embodiment of the present invention.

Next, a method for fabricating the wiring substrate for use in the semiconductor apparatus according to the third embodiment of the present invention will be described. FIG. 10 is a diagram illustrating a method for fabricating the printed-wiring board 1-3 shown in FIGS. 8 and 9. FIGS. 10(*a*) to 10(*h*) are diagrams illustrating cross sections of the printed-wiring board 1-3 in fabrication process steps (a) to (h), respectively. The process steps (a) to (d) are the same as the respective process steps (a) to (d), shown in FIG. 3, according to the first embodiment of the present invention, and the description thereof is not given. The process step (e) and the subsequent process steps will be described.

In a process step (e), the solder resist 4 is applied to both the top and the bottom surfaces of the substrate core 7 to which the conductor layer 2 is laminated so as to pattern the substrate core 7. The solder resist 4 applied to the top surface of the substrate core 7 has such a thickness as to prevent the surface from being uneven due to the vias and wirings as described for the process step (e), shown in FIG. 3, according to the first embodiment of the present invention. Further, the vias 3 in which the substrate core 7 has the copper-foil-plated surface is filled with the solder resist 4. In a process step (f), the solder resist 4 laminated to the top surface of the printed-wiring board 1-3 is subjected to half-etching process in a half-etching process area 180, described below, for forming the half-etched area 18. In the half-etching process performed in the half-etching process area 180, the entire solder resist 4 laminated to the top surface of the printed-wiring board 1-3 is not removed, and the upper portion of the solder resist 4 laminated to the top surface of the printed-wiring board 1-3 is etched and removed so as not to expose the substrate core 7 and the conductor layer 2 with which the substrate core 7 is patterned. In a process step (g), the solder resist 4 in the bonding pad positioning area 5 on the top surface of the printed-wiring board 1-3 is etched and removed. The bonding pad positioning area 5 is a part of the half-etching process area 180, and the solder resist 4 having been subjected to the half-etching process is etched and removed in the bonding pad positioning area 5, so that the half-etched area 18 is formed in a portion closest (closest to an area in which the semiconductor chip 13 is mounted) to the center of the printed-wiring board 1-3 among the portions bordering the resist opening of the bonding pad positioning area 5. Further, the solder resist 4 of the ball positioning area 10 on the bottom surface of the printed-wiring board 1-3 is etched and removed. In a process step (h), the bonding pad 6 is positioned on the surface of the conductor layer 2 exposed in the bonding pad positioning area 5, and the bonding pad 6 is Ni (8)/Au (9)-plated. Further, the surface of the conductor layer 2 exposed in the ball positioning area 10 is Ni (8)/Au (9)-plated.

As described above, in the semiconductor chip mounting area, the solder resist 4 is thickly applied to the top surface of the printed-wiring board 1-3, so that the indentations of the vias 3 are fully filled with the solder resist 4. As a result, formation of the indentations on the surface of the solder resist 4 is suppressed in the semiconductor chip mounting area. Therefore, when the semiconductor chip 13 is mounted, it is difficult to generate bubbles (voids) between the solder resist 4 and the paste 12 or between the paste 12 and the semiconductor chip 13, and separation between the solder resist 4 and the paste 12 or between the paste 12 and the semiconductor chip 13 can be suppressed. Further, the half-etched area 18 is formed in a portion closest (closest to the area in which the semiconductor chip 13 is mounted) to the center of the printed-wiring board 1-3 among the portions bordering the resist opening of the bonding pad positioning area 5, so that contact between the Au wire 11 and the solder resist 4 can be prevented.

As described above, in the wiring substrate for use in the semiconductor apparatus and the method for fabricating the wiring substrate according to the third embodiment of the present invention, the solder resist is thickened in the semiconductor chip mounting area, and therefore unevenness can be reduced in the semiconductor chip mounting area on the wiring substrate for use in the semiconductor apparatus, and, when the semiconductor chip is mounted, generation of bubbles (voids) between the semiconductor chip and the wiring substrate for use in the semiconductor apparatus is suppressed, and separation between the semiconductor chip and the wiring substrate for use in the semiconductor apparatus can be prevented, thereby realizing the wiring substrate for use in the semiconductor apparatus having such a stable quality as described above.

While the invention has been described in detail, the foregoing description is in all aspects illustrative and not restrictive. It is understood that numerous other modifications and variations can be devised without departing from the scope of the invention.

What is claimed is:

1. A wiring substrate for use in a semiconductor apparatus, comprising:
    a conductor layer laminated to a top surface and a bottom surface of a substrate core so as to pattern the substrate core;
    a via penetrating through the substrate core so as to electrically connect between the top surface and the bottom surface of the substrate core to which the conductor layer is laminated;
    a bonding pad positioning area positioned on the conductor layer laminated to the top surface of the substrate core; and
    a solder resist laminated to the top surface and the bottom surface of the substrate core to which the conductor layer is laminated, wherein the solder resist fills a portion in which the substrate core is penetrated, and the solder resist is not laminated to an external electrode positioning area on the bottom surface of the substrate core,
    wherein the solder resist laminated to the top surface of the substrate core is thickest in a center portion of the wiring substrate for use in the semiconductor apparatus on an inner area of the wiring substrate surrounded by the bonding pad positioning area, and forms a raised portion having a flat top surface.

2. The wiring substrate for use in the semiconductor apparatus according to claim 1, wherein the substrate core is shaped as a flat plate and made of an insulating material.

3. The wiring substrate for use in the semiconductor apparatus according to claim 1, wherein a via surface portion of the via which penetrates through the substrate core is copper-foil-plated so as to electrically connect between the conductor layer laminated to the top surface of the substrate core and the conductor layer laminated to the bottom surface of the substrate core.

4. The wiring substrate for use in the semiconductor apparatus according to claim 1, wherein the center portion is a semiconductor chip mounting area.

5. The wiring substrate for use in the semiconductor apparatus according to claim 1, wherein a thickness of the solder resist laminated to a half-etched area positioned between the bonding pad positioning area and the center portion is smaller than a thickness of the solder resist laminated to the center portion.

6. The wiring substrate for use in the semiconductor apparatus according to claim 4, wherein sides of the semiconductor chip mounting area are each at least 150 µm longer than a side of a semiconductor chip to be mounted.

7. A semiconductor apparatus comprising:
    a semiconductor chip;
    a wiring substrate, for use in the semiconductor apparatus, having the semiconductor chip mounted thereon;
    an attaching component for connecting between the semiconductor chip and the wiring substrate for use in the semiconductor apparatus;
    a metal thin wire for electrically connecting between the semiconductor chip and the wiring substrate for use in the semiconductor apparatus; and
    a sealing resin for collectively sealing the semiconductor chip, the wiring substrate for use in the semiconductor apparatus, the attaching component, and the metal thin wire,
    where in the wiring substrate for use in the semiconductor apparatus includes:
        a conductor layer laminated to a top surface and a bottom surface of a substrate core so as to pattern the substrate core;
        a via penetrating through the substrate core so as to electrically connect between the top surface and the bottom surface of the substrate core to which the conductor layer is laminated;
        a bonding pad positioning area positioned on the conductor layer laminated to the top surface of the substrate core; and
        a solder resist laminated to the top surface and the bottom surface of the substrate core to which the conductor layer is laminated, wherein the solder resist fills a portion in which the substrate core is penetrated, and the solder resist is not laminated to an external electrode positioning area on the bottom surface of the substrate core, and
    wherein the solder resist laminated to the top surface of the substrate core is thickest in a center portion of the wiring substrate for use in the semiconductor apparatus on an inward side of the wiring substrate than the bonding pad positioning area, and forms a raised portion having a flat top surface.

* * * * *